United States Patent
Margarit et al.

(10) Patent No.: US 9,270,280 B1
(45) Date of Patent: Feb. 23, 2016

(54) HALF-INTEGER FREQUENCY DIVIDERS THAT SUPPORT 50% DUTY CYCLE SIGNAL GENERATION

(71) Applicant: Integrated Device Technology, Inc., San Jose, CA (US)

(72) Inventors: Mihai A. Margarit, San Jose, CA (US); Mohamed AH. Mostafa, Santa Clara, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 208 days.

(21) Appl. No.: 14/136,012

(22) Filed: Dec. 20, 2013

(51) Int. Cl.
 H03K 21/00 (2006.01)
 H03K 23/00 (2006.01)
 H03K 23/70 (2006.01)
 H03K 21/38 (2006.01)
 H03K 21/02 (2006.01)
 H03K 23/68 (2006.01)

(52) U.S. Cl.
 CPC ............ H03K 23/70 (2013.01); *H03K 21/00* (2013.01); *H03K 21/023* (2013.01); *H03K 21/38* (2013.01); *H03K 23/00* (2013.01); *H03K 23/68* (2013.01)

(58) Field of Classification Search
 None
 See application file for complete search history.

(56) References Cited

U.S. PATENT DOCUMENTS

| | | | |
|---|---|---|---|
| 6,008,703 A | 12/1999 | Perrott et al. | |
| 6,501,816 B1 | 12/2002 | Kouznetsov et al. | |
| 6,760,397 B2 | 7/2004 | Wu et al. | |
| 6,760,398 B2 * | 7/2004 | Casagrande | 377/47 |
| 6,842,054 B2 * | 1/2005 | Wang | 327/115 |
| 7,298,810 B2 | 11/2007 | Ke | |
| 7,327,820 B2 | 2/2008 | Meninger et al. | |
| 7,417,474 B1 * | 8/2008 | Jamal | 327/117 |
| 7,564,276 B2 | 7/2009 | Narathong et al. | |
| 7,680,238 B2 * | 3/2010 | Lin | 377/47 |
| 7,924,069 B2 | 4/2011 | Narathong et al. | |
| 7,924,965 B2 * | 4/2011 | Tseng et al. | 377/47 |
| 8,552,770 B2 | 10/2013 | Cavin | |
| 8,559,587 B1 | 10/2013 | Buell et al. | |
| 8,565,368 B1 | 10/2013 | Chen et al. | |
| 2007/0160179 A1 | 7/2007 | Narathong et al. | |
| 2009/0296878 A1 * | 12/2009 | Tsai | 377/47 |
| 2014/0003569 A1 | 1/2014 | Martin | |
| 2014/0312936 A1 | 10/2014 | Abdel-Haleem et al. | |

OTHER PUBLICATIONS

Ashour et al. "Extended division range 2/3 chain frequency divider with dynamic control word", *Proceedings of 2010 IEEE International Symposium on Circuits and Systems (Iscas)*, 4141-4144, May 30, 2010-Jun. 2, 2010.

(Continued)

*Primary Examiner* — Tuan T Lam
(74) *Attorney, Agent, or Firm* — Myers, Bigel, et al.

(57) ABSTRACT

A fractional-N frequency divider includes a half-integer frequency divider and a duty cycle adjustment circuit. The half-integer frequency divider includes a multi-modulus divider containing a cascaded chain of div2/3 cells, which is responsive to a multi-bit modulus control signal, and a phase control circuit configured support half-integer frequency division by the multi-modulus divider, by providing an input terminal of the multi-modulus divider with a periodically phase-flipped input signal having a first frequency. The duty-cycle adjustment circuit is configured to generate a divider output signal with a 50% duty cycle in response to a periodic signal generated by the half-integer frequency divider.

17 Claims, 5 Drawing Sheets

(56) References Cited

OTHER PUBLICATIONS

Perrott, 6.976 High Speed Communication Circuits and Systems—Lecture 14—High Speed Frequency Dividers; MIT Open Courseware; Massachusetts Institute of Technology, Copyright © 2003 by Michael H. Perrott; 46 pages.

Perrott, 6.976 High Speed Communication Circuits and Systems—Lecture 15—Integer-N Frequency Synthesizers; MIT Open Courseware; Massachusetts Institute of Technology, Copyright © 2003 by Michael H. Perrott; 52 pages.

Perrott, 6.976 High Speed Communication Circuits and Systems—Lecture 18—Design and Simulation of Frequency Synthesizers; MIT Open Courseware; Massachusetts Institute of Technology, Copyright © 2003 by Michael H. Perrott; 37 pages.

Ray et al. "A 13GHz Low Power Multi-Modulus Divider Implemented in 0.13µm SiGe Technology", *IEEE Topical Meeting on Silicon Monolithic Integrated Circuits in RF Systems, SiRF* '09, Jan. 19-21, 2009, 1-4.

Sandireddy et al. "A Generic Architecture for Multi-Modulus Dividers in Low-Power and High-Speed Frequency Synthesis", *2004 Topical Meeting on Silicon Monolithic Integrated Circuits in RF Systems*, 2004, 243-246.

Vaucher et al. "A Family of Low-Power Truly Modular Programmable Dividers in Standard 0.35-µm CMOS Technology", *IEEE Journal of Solid-State Circuits*, vol. 35, No. 7, Jul. 2000, 1039-1045.

Yang et al. "A Dual-Mode Truly Modular Programmable Fractional Divider Based on a 1/1.5 Divider Cell", IEEE Microwave and Wireless Components Letters, vol. 15, No. 11, pp. 754-756, Nov. (2005).

\* cited by examiner

HALF-INTEGER FREQUENCY DIVIDERS THAT SUPPORT 50% DUTY CYCLE SIGNAL GENERATION

CROSS-REFERENCE TO RELATED APPLICATION

This application is related to U.S. application Ser. No. 14/013,599, filed Aug. 29, 2013, entitled "Self-Adaptive Multi-Modulus Dividers Containing DIV2/3 Cells Therein," now U.S. Pat. No. 9,118,333, the disclosure of which is hereby incorporated herein by reference.

FIELD OF THE INVENTION

The present invention relates to integrated circuit devices and, more particularly, to multi-modulus divider circuits used for clock generation.

BACKGROUND OF THE INVENTION

Phase-locked loop (PLL) integrated circuits are frequently used to generate clock signals for synchronous integrated circuit systems. As will be understood by those skilled in the art, PLL integrated circuits may multiply a reference clock frequency by some number to thereby generate a relatively high frequency clock. This multiplying number can be a fractional number if fractional dividers are utilized in a feed-back loop of the PLL. One typical technique to implement a fractional divider is to utilize a multi-modulus divider (MMD) with a delta-sigma modulator (DSM), which outputs a sequence of integer numbers having a fractional average value. The MMD uses these integer numbers as divisors. For example, these integer numbers can be any one of [N1, N2], where N1 and N2 are determined by the desired fractional number and the DSM order. To achieve proper operation, there should be no delays or intermediate divisors of the MMD. One example of fractional divider is disclosed in commonly assigned U.S. Pat. No. 8,559,587 entitled "Fractional-N Dividers Having Divider Modulation Circuits Therein with Segmented Accumulators," the disclosure of which is hereby incorporated herein by reference.

An example of a programmable MMD with extended range is disclosed in an article by Cicero S. Vaucher et al., entitled "A Family of Low-Power Truly Modular Programmable Dividers in Standard 0.35-urn CMOS Technology," IEEE JSSC, Vol. 35, No. 7, July 2000. A shown by FIGS. 1-2, a portion of this MMD 100 includes several stages of div2/3 cells 110 and logic circuits (e.g., OR gates, inverters). Each div2/3 cell includes four (4) level-sensitive D-type latches and three (3) AND gates, connected as illustrated. When signal MODin=1 and signal P=1, a divide-by-3 function is realized so that the states 201, 202 change as follows: (0,1)→(1,1)→(0,0)→(0,1). In addition, when signal MODin=0 and signal P=X (i.e., X=0 or 1), a divide-by-2 function is realized so that the states 201, 202 of corresponding D-type latches change as follows: (0,1)→(1,1)→(0,1). Thus, when node 201 is logic 1, MODout repeats the value of MODin and when node 201 is logic 0, MODout is logic 0, with the latch states changing at negative edges of signal Fin. As shown by FIG. 1, each stage of div2/3 cells samples its own MODin and generates its own MODout, with the right-most input MODin being set high to a logic "1" value. Based on this configuration, each MODout signal is a positive pulse with the pulse width being one period of its own Fin. During this period, each stage has one chance to perform a "check", when its MODin is high, to determine whether it is supposed to function as a divide-by-3 cell or a divide-by-2 cell depending on its input P. The period of Fout (i.e., Tout) is related to the period of Fin (i.e., Tin) as follows:

$$Tout=Tin(P<0>+P<1>2^1+\ldots+P<n-1>2^{n-1}+P<n>2^n),$$

which means the divisor is equivalent to the binary number $P<n:0>$ ($2 \leq P<n:0> \leq 2^{n+1}-1$). Unfortunately, one problem with the MMD of FIGS. 1-2 is that when a new $P<n:0>$ is loaded, the divisor does not directly change to the new divisor, but can get an uncertain intermediate value before becoming the new value. This property of the MMD of FIGS. 1-2 is not acceptable for fractional divider applications where any discrepancy will result in an error division ratio. U.S. Pat. No. 6,760,397 to Wu et al. and U.S. Pat. No. 6,501,816 to Kouznetsov et al. also disclose efforts to develop multi-modulus dividers for programmable frequency divider and fractional-N divider applications.

Still further conventional dividers may use cascaded chains of cells that divide by two or three as a function of a modulus control bit (MC) (e.g., ÷2 for MC=0, ÷3 for MC=1). Thus, a cascade of N cells can take any divide ratio from $2^N$ to $2^{N+1}-1$ as a function of $MC_1$ through $MC_N$. Unfortunately, the duty cycle of the output divided frequency is typically less than 50%, which is a requirement for many frequency generating circuits for timing applications. A typical solution to achieve the 50% duty cycle requirement is to terminate the frequency divider chain by a divide-by-two flip-flop, which is triggered only by rising (or falling) edges at its input. As will be understood by those skilled in the art, the output of the flip-flop is high for one period of the incoming signal and low for the next period, such that the duty cycle is always 50%. But, with this solution, the output divide ratios can only take even values (e.g., 4, 6, 8, 10 . . . ). An attempt to correct this limitation by providing multi-modulus dividers that support 50% duty cycle output signals is disclosed in an article by Yu-Che Yang et al., entitled "A Dual-Mode Truly Modular Programmable Fractional Divider Based on a 1/1.5 Divider Cell," IEEE Microwave and Wireless Components Letters, Vol. 15, No. 11, pp. 754-756, November (2005).

SUMMARY OF THE INVENTION

A frequency divider according to embodiments of the invention can include a multi-modulus divider and a phase control circuit. The multi-modulus divider includes a cascaded chain of div2/3 cells, which is responsive to a multi-bit modulus control signal. The phase control circuit is configured support half-integer frequency division by the multi-modulus divider, by providing an input terminal of the multi-modulus divider with a periodically phase-flipped input signal having a first frequency. This input signal may be a single-sided or differential input signal and the periodicity of the phase-flipped input signal may be synchronized with a divider output signal generated at an output terminal of the multi-modulus divider.

The frequency divider may also include a duty-cycle adjustment circuit, which is configured to adjust a duty cycle of the divider output signal generated at the output terminal of the multi-modulus divider. In particular, the duty-cycle adjustment circuit may be configured to adjust a non-uniform duty cycle the divider output signal upward to a 50% duty cycle. In some of these embodiments, the duty-cycle adjustment circuit may be configured as a D-type flip-flop having a clock terminal responsive to the divider output signal. This D-type flip-flop may perform a dual-function by generating a control signal for the phase control circuit, which synchronizes its operation.

According to some additional embodiments of the invention, the phase control circuit may include a multiplexer having: (i) first and second differential input terminals responsive to a pair of high frequency "differential" signals generated by a voltage-controlled oscillator (VCO), for example, (ii) a select terminal responsive to a first output "control" signal (e.g., Q) generated by the D-type flip-flop and (iii) a differential output terminal electrically coupled to the input terminal of the multi-modulus divider. A data input terminal of the D-type flip-flop is also responsive to a second output signal (e.g., QB) generated by the D-type flip-flop. These first and second output signals generated by the D-type flip-flop are typically complementary signals (e.g., Q and QB), which are synchronized to the divider output signal. Connecting the data input to the QB output performs the divide-by-two operation and corrects the duty cycle to 50%.

According to still further embodiments of the invention, a fractional-N frequency divider includes a half-integer frequency divider and a duty cycle adjustment circuit. The half-integer frequency divider includes a multi-modulus divider containing a cascaded chain of div2/3 cells, which is responsive to a multi-bit modulus control signal, and a phase control circuit configured support half-integer frequency division by the multi-modulus divider by providing an input terminal of the multi-modulus divider with a periodically phase-flipped differential input signal having a first frequency. The duty-cycle adjustment circuit is configured to generate a divider output signal with a 50% duty cycle in response to a periodic signal generated by the half-integer frequency divider.

DETAILED DESCRIPTION OF EMBODIMENTS

Figure 1:
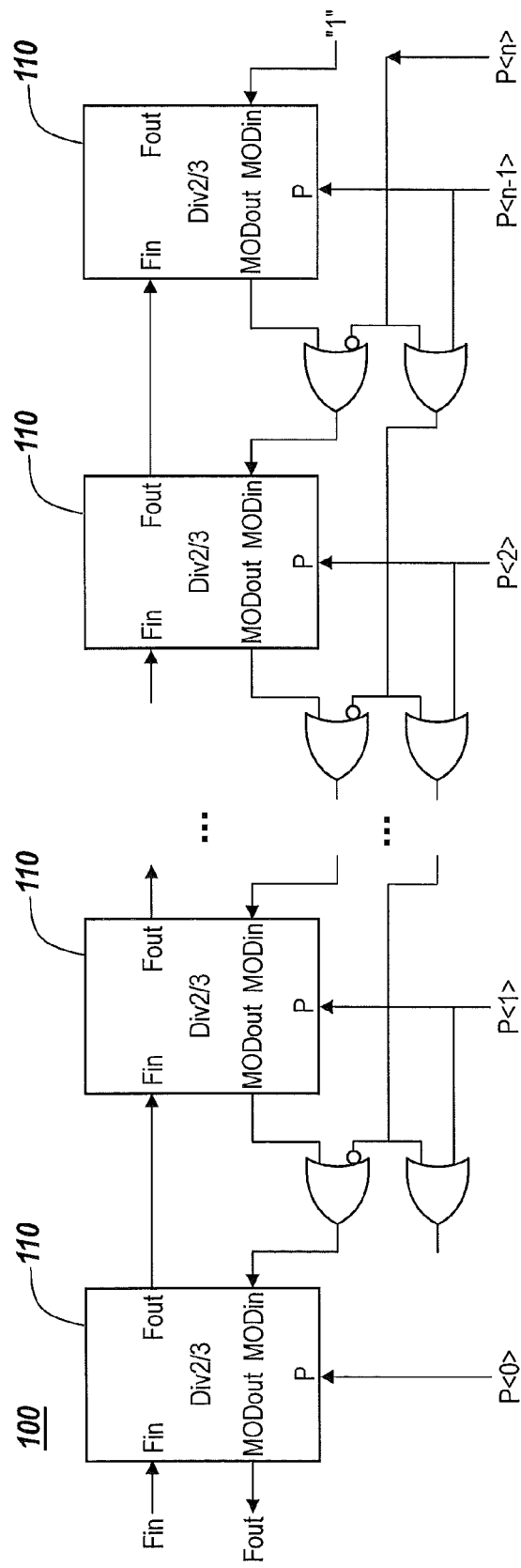
FIG. 1 is an electrical schematic of a multi-modulus divider (MMD) according to the prior art.
Figure 2:
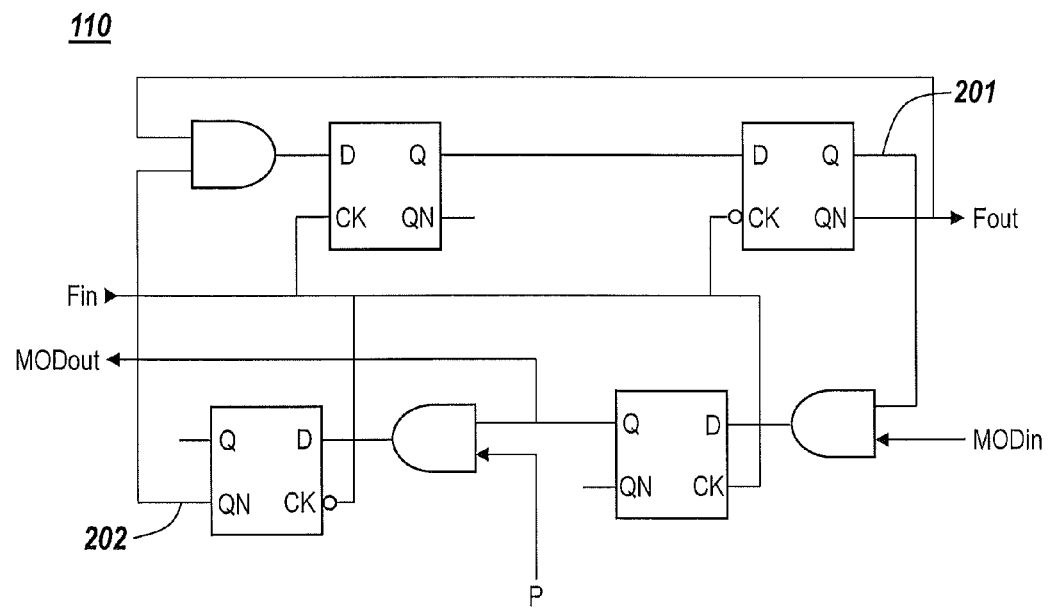
FIG. 2 is an electrical schematic of a div2/3 cell that can be used in the MMD of FIG. 1, according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
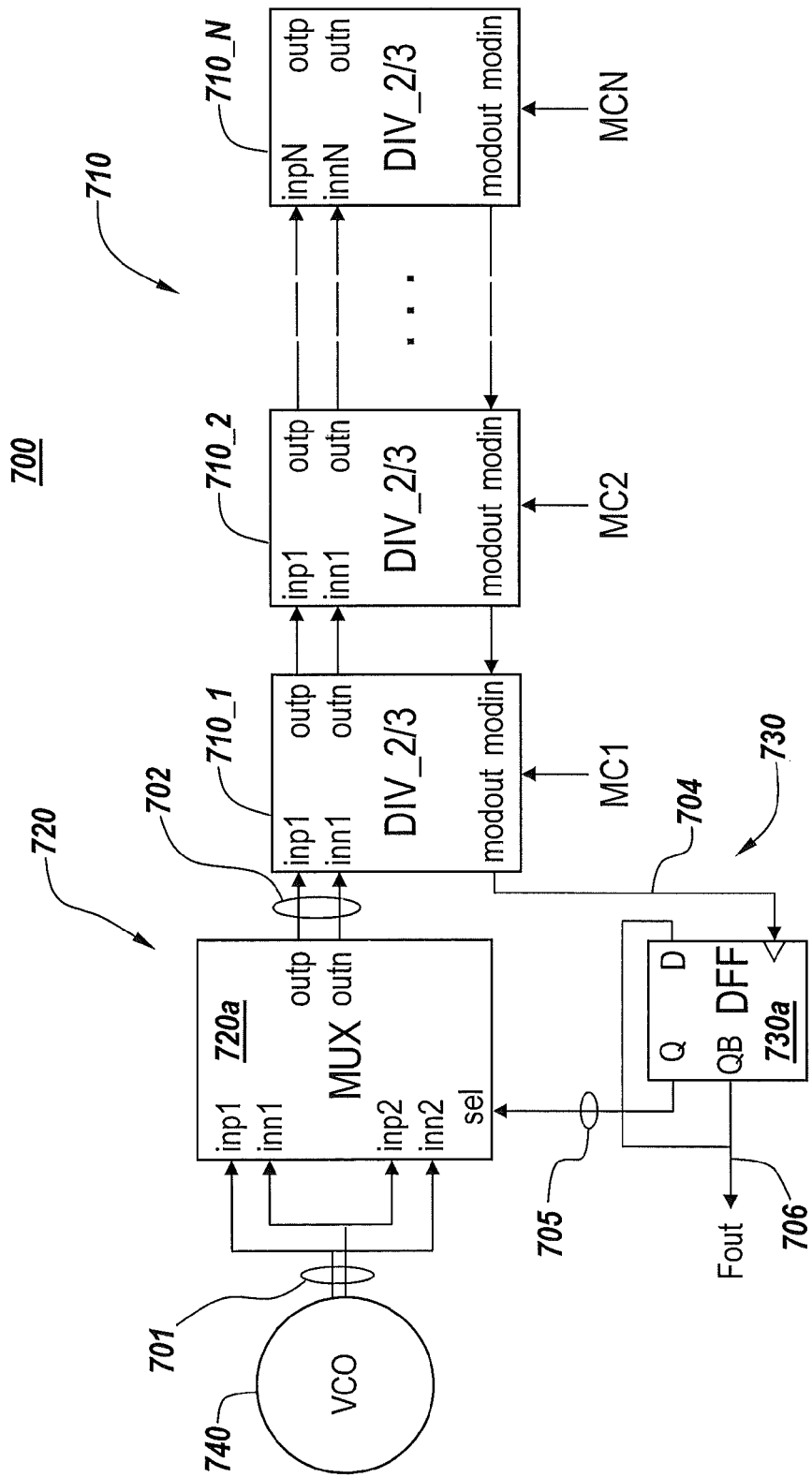
FIGS. 3A-3B are electrical schematics of frequency dividers that support half-integer frequency division and duty-cycle adjustment, according to embodiments of the present invention.

FIG. 3A illustrates a frequency divider 700 according to an embodiment of the present invention, which may be used in some applications as a fractional-N frequency divider circuit.

As shown, the frequency divider 700 includes a half-integer frequency divider (710, 720) and a duty cycle adjustment circuit 730, which may perform multiple functions. The half-integer frequency divider includes a multi-modulus divider 710 containing a cascaded chain of div2/3 cells 710_1, 710_2, ..., 710_N, which is responsive to a multi-bit modulus control signal (MC1, MC2, ..., MCN), and a phase control circuit 720. This phase control circuit 720 is configured support half-integer frequency division by the multi-Modulus divider 710 by providing an input terminal (e.g., differential input terminal (inp1, inn1)) of the multi-modulus divider 710 with a periodically phase-flipped differential input signal 702 having a first frequency (e.g., high frequency). The duty-cycle adjustment circuit 730 is configured to generate an output signal 706 (Fout) with a 50% duty cycle in response to a periodic divider output signal 704 generated by the half-integer frequency divider (710, 720). In particular, the periodicity of the phase-flipped differential input signal 702 may be synchronized with the divider output signal 704 generated at an output terminal of the multi-modulus divider 710. In this manner, the phase of the differential input signal 702 is flipped 180° every complete division cycle.

As further illustrated by the embodiment of FIG. 3A, the duty-cycle adjustment circuit 730, which adjusts a non-uniform duty cycle of the divider output signal 704 upward to 50%, may be configured as a D-type flip-flop 730a having an input clock terminal responsive to the divider output signal 704. This D-type flip-flop 730a may further perform an additional function by generating a phase control signal 705, which is provided as an input to the phase control circuit 720 and synchronizes its operation. For example, this phase control signal 705 may be provided as the "true" output Q of the D-type flip-flop (DFF) 730a. As shown, the phase control circuit 720 may include a multiplexer 720a having: (i) first and second differential input terminals ((inp1, inn1), (inp2, inn2)) responsive to a pair of high frequency "differential" signals 701 generated by a high frequency signal generator (e.g., voltage-controlled oscillator 740 (VCO)), (ii) a select terminal responsive to a first output "phase control" signal (e.g., Q) generated by the D-type flip-flop 730a, and (iii) a differential output terminal (outp, outn) electrically coupled to the input terminal (inp1, inn1) of the multi-modulus divider 710 (i.e., input of div2/3 cell 710_1). A data input terminal (D) of the D-type flip-flop 730a is also responsive to a second output signal 706 (e.g., QB) generated as a feedback signal by the D-type flip-flop 730a. These first and second output signals (Q, QB) generated by the D-type flip-flop 730a are complementary signals, which are synchronized to the divider output signal 704.

Figure 3B:
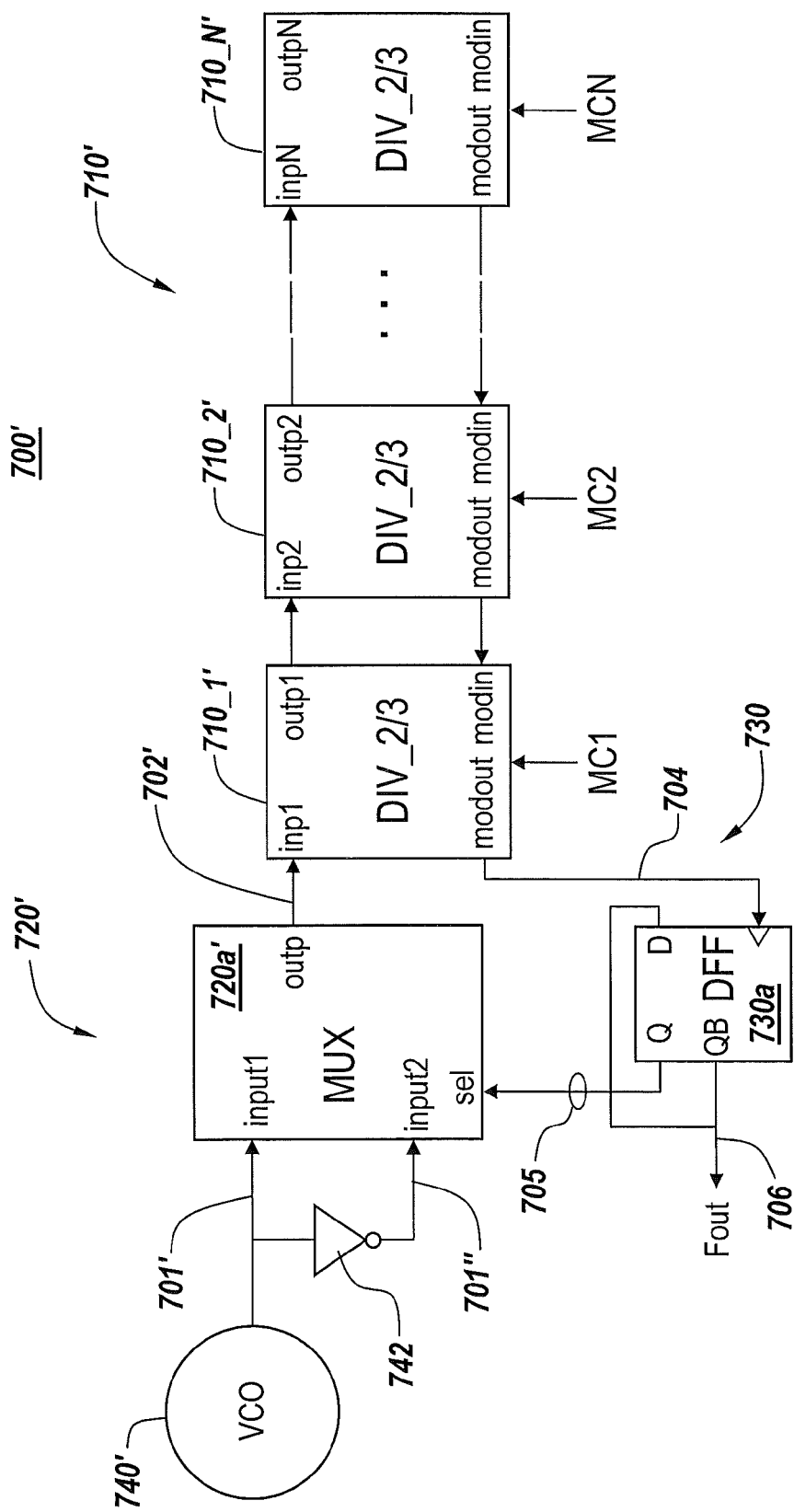

FIG. 3B illustrates a frequency divider 700' according to another embodiment of the present invention, which is similar to the embodiment of FIG. 3A. In particular, the frequency divider 700' includes a half-integer frequency divider (710', 720') and a duty cycle adjustment circuit 730, which may perform multiple functions. The half-integer frequency divider includes a multi-modulus divider 710' containing a cascaded chain of div2/3 cells 710_1', 710_2', ..., 710_N', which is responsive to a multi-bit modulus control signal (MC1, MC2, ..., MCN), and a phase control circuit 720'. This phase control circuit 720' is configured support half-integer frequency division by the multi-modulus divider 710' by providing an input terminal (e.g., single-sided input terminal (inp1)) of the multi-modulus divider 710' with a periodically phase-flipped input signal 702' having a first frequency (e.g., high frequency). The duty-cycle adjustment circuit 730 is configured to generate an output signal 706 (Fout) with a 50% duty cycle in response to a periodic divider output signal 704 generated by the half-integer frequency divider (710', 720'). As described above with respect to FIG. 3A, the periodicity of the phase-flipped input signal 702' may be synchronized with the divider output signal 704 generated at an output terminal of the multi-modulus divider 710'. In this manner, the phase of the input signal 702' is flipped 180° every complete division cycle using a feedback synchronization technique.

Figure 4:
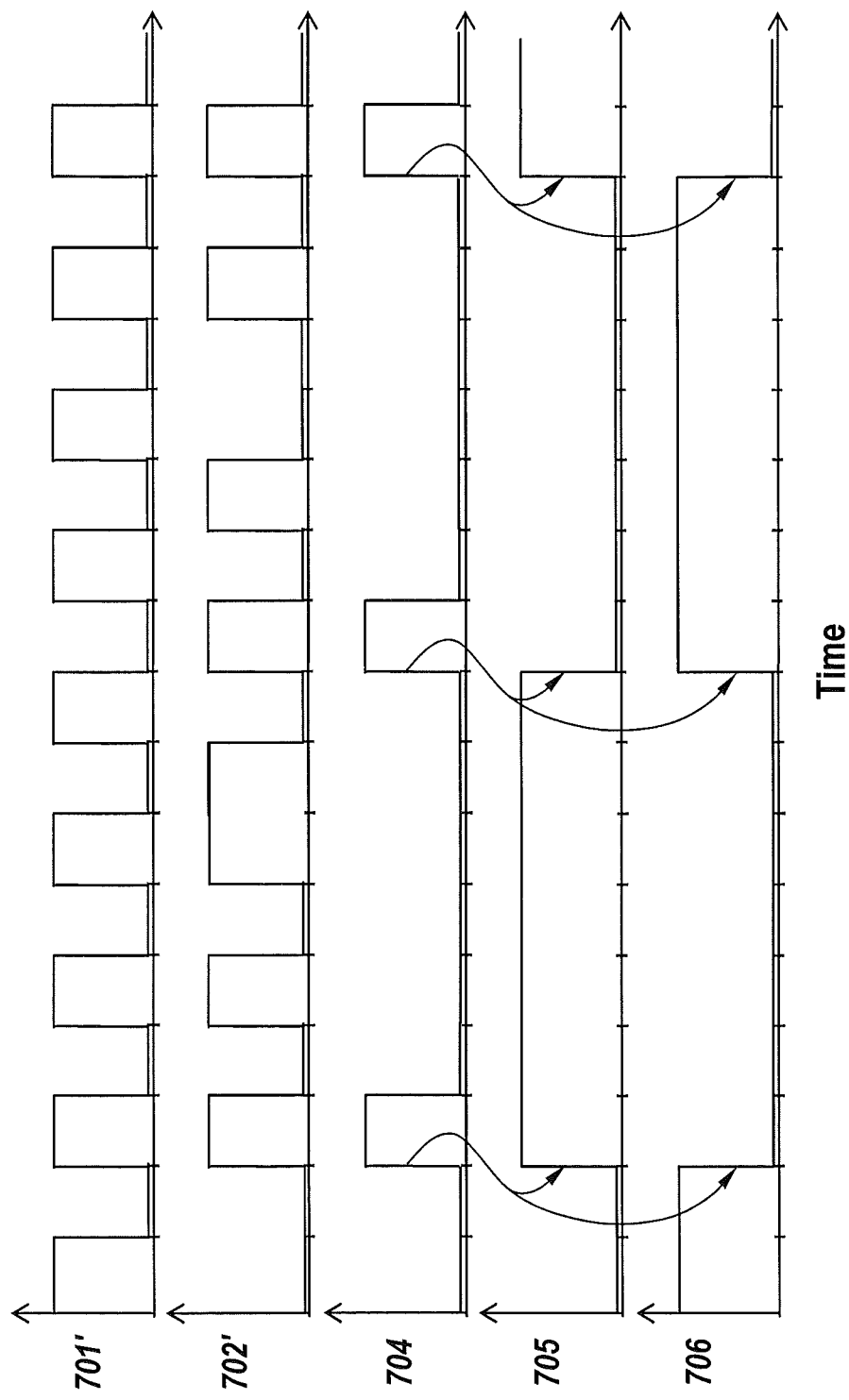
FIG. 4 is a timing diagram that illustrates operation of the divider of FIG. 3B for a division value of 3.5×2.

As further illustrated by the embodiment of FIG. 3B, the duty-cycle adjustment circuit 730, which adjusts a non-uniform duty cycle of the divider output signal 704 from typically much less than 50% upward to 50%, may be configured as a D-type flip-flop 730a having an input clock terminal responsive to the divider output signal 704. This D-type flip-flop 730a may further perform an additional function by generating a phase control signal 705 (with a 50% duty cycle), which is provided as an input to the phase control circuit 720' and synchronizes its operation. For example, this phase control signal 705 may be provided as the "true" output Q of the D-type flip-flop (DFF) 730a. As shown, the phase control circuit 720' may include a multiplexer 720a' having: (i) first and second single-sided input terminals (input1, input2) responsive to a pair of high frequency signals (701', 701'') that are 180° out-of-phase relative to each other (generated by a high frequency signal generator (e.g., voltage-controlled oscillator 740 (VCO) and inverter 742), (ii) a select terminal responsive to a first output "phase control" signal (e.g., Q) generated by the D-type flip-flop 730a, and (iii) an output terminal (outp) electrically coupled to the input terminal (inp1) of the multi-modulus divider 710' (i.e., single-sided input of div2/3 cell 710_1'). A data input terminal (D) of the D-type flip-flop 730a is also responsive to a second output signal 706 (e.g., QB) generated as a feedback signal by the D-type flip-flop 730a. These first and second output signals 706, 705 (Q, QB) generated by the D-type flip-flop 730a are complementary signals that are synchronized to the divider output signal 704 and have 50% duty cycles. These aspects of the embodiment of FIG. 3B are illustrated more fully by the timing diagram of FIG. 4, which highlights the timing of the signals 701', 702', 704, 705 and 706 (Fout) for the case where the multi-bit modulus control signal (MC1, MC2, ..., MCN) sets a divide value of 3.5 within the multi-modulus divider 710', which is doubled by the D-type flip-flop 730a to an odd integer of seven (7). Furthermore, the embodiments of the invention described herein may be utilized to adjust the reduced duty cycle output signals generated by other types of fractional-N frequency divider circuits, such as those highlighted at FIGS. 3-6 of the aforementioned U.S. application Ser. No. 14/013,599, filed Aug. 29, 2013.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A frequency divider, comprising:
    a multi-modulus divider comprising a cascaded chain of div2/3 cells, which is responsive to a multi-bit modulus control signal;
    a phase control circuit configured support half-integer frequency division by said multi-modulus divider by providing an input terminal of said multi-modulus divider with a periodically phase-flipped input signal having a first frequency; and
    a duty-cycle adjustment circuit configured to adjust a duty cycle of a divider output signal generated at an output terminal of said multi-modulus divider and driving said phase control circuit with a control signal that synchronizes timing of the periodically phase-flipped input signal.

2. The divider of claim 1, wherein the input terminal of said multi-modulus divider is a differential terminal but the output terminal of said multi-modulus divider is a single-sided terminal.

3. The divider of claim 2, wherein said phase control circuit comprises a multiplexer having first and second differential input terminals and a differential output terminal electrically coupled to the differential input terminal of said multi-modulus divider.

4. A frequency divider, comprising:
a multi-modulus divider comprising a cascaded chain of div2/3 cells, which is responsive to a multi-bit modulus control signal;
a phase control circuit configured support half-integer frequency division by said multi-modulus divider by providing an input terminal of said multi-modulus divider with a periodically phase-flipped input signal having a first frequency; and
a duty-cycle adjustment circuit configured to adjust a non-uniform duty cycle of a divider output signal generated at an output terminal of said multi-modulus divider upward to a 50% duty cycle, said duty-cycle adjustment circuit comprising a D-type flip-flop having a clock terminal responsive to the divider output signal.

5. The divider of claim 4, wherein said phase control circuit comprises a multiplexer having first and second differential input terminals, a select terminal responsive to a first output signal generated by the D-type flip-flop and a differential output terminal electrically coupled to the input terminal of said multi-modulus divider.

6. The divider of claim 5, wherein a data input terminal of the D-type flip-flop is responsive to a second output signal generated by the D-type flip-flop.

7. The divider of claim 6, wherein the first and second output signals generated by the D-type flip-flop are complementary signals.

8. A fractional-N frequency divider, comprising:
a half-integer frequency divider, comprising:
a multi-modulus divider comprising a cascaded chain of div2/3 cells, which is responsive to a multi-bit modulus control signal; and
a phase control circuit configured support half-integer frequency division by said multi-modulus divider by providing an input terminal of said multi-modulus divider with a periodically phase-flipped input signal having a first frequency; and
a duty-cycle adjustment circuit configured to generate an output signal with a 50% duty cycle in response to a periodic signal generated by said half-integer frequency divider having a less than 50% duty cycle, said duty-cycle adjustment circuit comprising a D-type flip-flop having a clock terminal responsive to the periodic signal generated by said half-integer frequency divider;
wherein said phase control circuit comprises a multiplexer having a select terminal responsive to a first output signal generated by the D-type flip-flop and an output terminal electrically coupled to the input terminal of said multi-modulus divider.

9. The divider of claim 8, wherein a data input terminal of the D-type flip-flop is responsive to a second output signal generated as feedback by the D-type flip-flop.

10. A frequency divider, comprising:
a half-integer frequency divider, comprising:
a multi-modulus divider comprising a cascaded chain of divider cells, which is responsive to a multi-bit modulus control signal; and
a phase control circuit configured support half-integer frequency division by said multi-modulus divider by providing an input terminal of said multi-modulus divider with an input signal having a first frequency; and
a duty-cycle adjustment circuit responsive to a periodic output signal generated by said half-integer frequency divider, said duty-cycle adjustment circuit configured to perform at least a dual function of generating a signal having an increased duty cycle relative to the periodic output signal and driving said phase control circuit with a control signal that synchronizes timing of the input signal.

11. The divider of claim 10, wherein the input signal is a periodically phase-flipped signal that is synchronized with the control signal generated by said duty-cycle adjustment circuit.

12. The divider of claim 10, wherein the input signal is a differential input signal that is phase-flipped 180° in-sync with the control signal generated by said duty-cycle adjustment circuit.

13. The divider of claim 10, wherein said duty-cycle adjustment circuit comprises a D-type flip-flop having a clock terminal responsive to the periodic output signal generated by said half-integer frequency divider.

14. The divider of claim 10, wherein the divider cells are div2/3 cells.

15. A fractional-N frequency divider, comprising:
a multi-modulus divider comprising a cascaded chain of div2/3 cells, which is responsive to a multi-bit modulus control signal; and
a phase control circuit configured to provide an input terminal of said multi-modulus divider with a periodically phase-flipped input signal having a first frequency, said phase control circuit comprising a multiplexer having first and second input terminals, a select terminal and an output terminal at which the periodically phase-flipped input signal is generated; and
a duty-cycle adjustment circuit configured to: (i) generate an output signal having a second duty cycle in response to a periodic signal having a first duty cycle, which is generated by said half-integer frequency divider, and (ii) provide the select terminal of the multiplexer with a control signal that synchronizes the periodic phase-flipping of the input signal, where the second duty cycle is greater than the first duty cycle, which is less than 50%.

16. The divider of claim 15, wherein said duty-cycle adjustment circuit comprises a D-type flip-flop having a clock terminal responsive to the periodic signal generated by said half-integer frequency divider.

17. The fractional-N frequency divider of claim 16, wherein one of a true and a complementary output of the D-type flip-flop is electrically connected to the select terminal and the other one of a true and a complementary output of the D-type flip-flop provides the output signal, which is fed back to a data input of the D-type flip-flop.

* * * * *